United States Patent [19]
Kim et al.

[11] Patent Number: 5,821,890
[45] Date of Patent: Oct. 13, 1998

[54] ΔΣ ANALOG-TO-DIGITAL CONVERTER HAVING BUILT-IN VARIABLE-GAIN END

[75] Inventors: Daejong Kim; Deog Kyoon Jeong, both of Seoul, Rep. of Korea

[73] Assignee: LG Semicon Co., Ltd., Chungcheongbuk-do, Rep. of Korea

[21] Appl. No.: 641,935

[22] Filed: May 2, 1996

[30] Foreign Application Priority Data

May 2, 1995 [KR] Rep. of Korea ................ 1995-10740

[51] Int. Cl.⁶ .............................. H03M 3/02; H03M 1/12
[52] U.S. Cl. ........................................ 341/143; 343/155
[58] Field of Search ................................ 341/139, 155, 341/154, 143; 327/270, 287

[56] References Cited

U.S. PATENT DOCUMENTS

| | | | |
|---|---|---|---|
| 5,541,599 | 7/1996 | Kasha et al. | 341/122 |
| 5,548,833 | 8/1996 | Townsend | 455/234.1 |
| 5,581,213 | 12/1996 | Under et al. | 330/282 |

OTHER PUBLICATIONS

Shih et al.; "A CMOS 5–V Analog Front End for 9600–bits/Facsimile Modems"; IEEE Journal of Solid–State Circuits, Dec. 1987, vol. SC–22, No. 6, pp. 990–995.

Kim et al.; "A Single Chip Δ–Σ ADC with a Built–In Variable Gain Stage and DAC with a Charge Integrating Subconverter for a 5 V 9600–b/s Modem"; IEEE Journal of Solid–State Circuits, Aug. 1995, vol. 30, No. 8, pp. 940–943.

Kim et al. A Single Chip Sigma delta . . . Charge Integrating Subconverter; IEEE Journal of Solid State Circuits, Aug. 1995, vol. 30, No. 8 pp. 940–943, Aug. 1995.

*Primary Examiner*—Marc S. Hoff
*Assistant Examiner*—Peguy JeanPierre
*Attorney, Agent, or Firm*—Loudermilk & Associates

[57] ABSTRACT

A ΔΣ analog-to-digital converter having a built-in variable gain end is disclosed including a ΔΣ analog-to-digital converter portion, the converter portion having an amplifier for amplifying and outputting an input signal, a charging device for accumulating a signal voltage, a plurality of switches coupling the input signal to the charging device and coupling the voltage accumulated in the charging device to the amplifier, and a comparator for producing a HIGH output if the output of the amplifier becomes above a predetermined level, and producing a LOW output if the output of the amplifier becomes below the predetermined level, and an AGC controller both ends of which are coupled to a reference voltage, the controller generating a voltage reduced into 1/N of the reference voltage through switches at respective nodes of a plurality of resistors.

20 Claims, 3 Drawing Sheets

ΔΣ ANALOG-TO-DIGITAL CONVERTER HAVING BUILT-IN VARIABLE-GAIN END

FIELD OF THE INVENTION

The present invention relates to ΔΣ analog-to-digital converters, and more particularly to ΔΣ analog-to-digital converters having an automatic gain control (AGC) function useful in an analog front end requiring a resolution of above 10 bits.

BACKGROUND OF THE INVENTION

In an analog front end (analog input port) used in a facsimile modem, an analog signal is input through a telephone line, passes through a filter for analog processing, and then through an AGC circuit for compensating for the attenuation of the telephone line. The analog signal is then converted into digital code. In short, the input analog signal passes through filter-to-AGC-to-A/D processes.

For such functions, a filter, AGC circuit and A/D converter are required. A conventional technology for a facsimile modem is described in a paper by Cheng-chung, Shih, et. al., entitled "A CMOS 5-V Analog Front End for 9600-bit/S Facsimile MODEMs" (IEEE Journal of Solid-State Circuits, Vol. SC-22, pp. 990–995, Dec. 1987).

In a conventional modem in which a digital signal is converted into analog form and then transmitted via telephone line, a band-pass filter typically is used. For an AGC circuit, a circuit having a capacitor-switching mode typically is used in which an input signal is stored in a capacitor as a signal charge. This charge is redistributed to a capacitor of different capacitance, and the magnitude of the output voltage is controlled by a capacitance ratio. For an analog-to-digital converter, a charge-redistributing or ΔΣ converter typically is used.

In such a conventional AGC circuit with a capacitor-switching mode, the resolution is determined by the matching tolerance between capacitors. In the case of a standard CMOS process, it is difficult for the resolution to surpass 10 bits. Accordingly, the resolution of the A/D converter, the next stage, is limited to within 10 bits.

The AGC also requires a precise capacitor processing. In order to correct the offset of the amplifier, an auto-zero technique must be introduced.

SUMMARY OF THE INVENTION

Therefore, it is an object of the present invention to provide a ΔΣ analog-to-digital converter having a variable gain end, which simplifies the hardware and the overall process.

In accordance with the present invention, there is provided one embodiment of a ΔΣ analog-to-digital converter having a variable gain end comprising: a ΔΣ analog-to-digital converter portion, the converter portion comprising an amplifier, a charging device for accumulating a signal voltage, a plurality of switches coupling the input signal to the charging device and coupling the voltage accumulated in the charging device to the amplifier, and a comparator for producing a HIGH output if the output of the amplifier rises above a predetermined level, and producing a LOW output if the output of the amplifier falls below the predetermined level; and an AGC controller both ends of which are coupled to a reference voltage, the controller generating a voltage reduced into 1/N from the reference voltage through switches at respective nodes of a plurality of resistors.

The amplifier preferably is a differential operational amplifier used in two stages. The AGC controller is connected in a trapezoid with two kinds of resistors. Respective switches preferably are NMOS transistors.

DETAILED DESCRIPTION OF THE PREFERRED EMBODIMENTS

Figure 1:
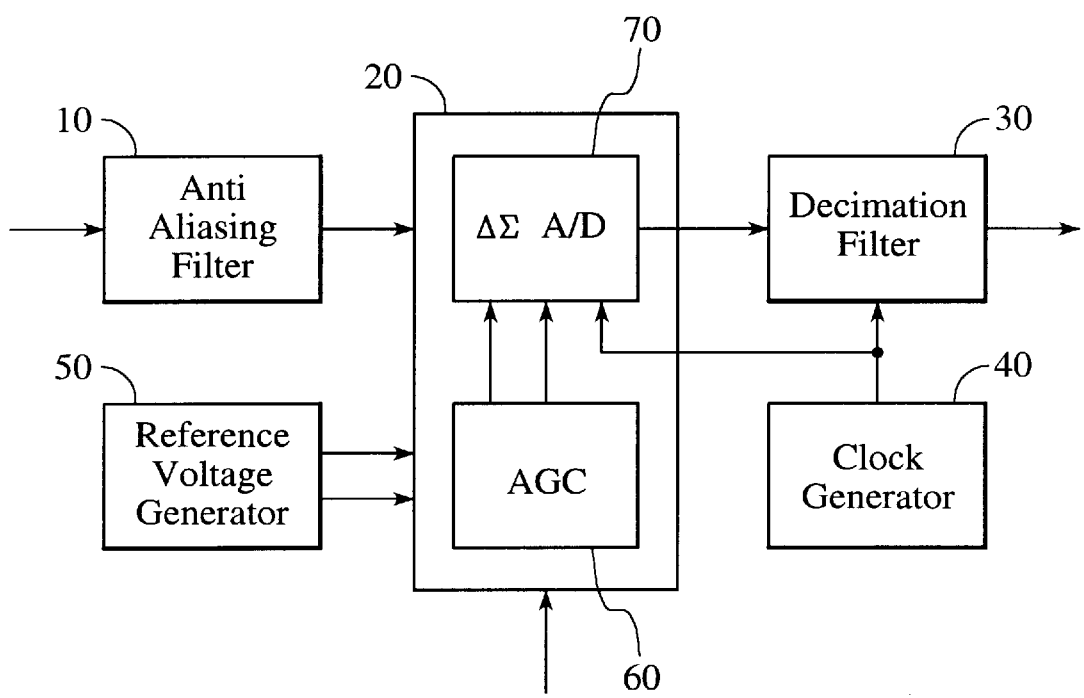
FIG. 1 is a block diagram illustrating one embodiment of a ΔΣ analog-to-digital converter having a variable gain end in accordance with the present invention.

Referring to FIGS. 1–4, preferred embodiments of the ΔΣ analog-to-digital converter in accordance with the present invention will be explained. Such embodiments include ΔΣ analog-to-digital converting portion 70 and AGC controller 60. FIG. 1 is a block diagram illustrating a portion of an analog front end of a facsimile modem to which the ΔΣ analog-to-digital converter in accordance with the present invention may be coupled.

Referring again to FIG. 1, an analog input signal is input to ΔΣ analog-to-digital converter 20 through anti-aliasing filter 10. In ΔΣ analog-to-digital converter 20, this signal is converted into a one-bit digital signal according to the clock of clock generator 40. The digitally converted signal may be output as a 12-bit parallel digital signal through decimation filter 30. ΔΣ analog-to-digital converter 20 is made up of AGC controller 60 which may be a resistor block, and ΔΣ analog-to-digital converter portion 70. The reference voltage of reference voltage generator 50 is applied to AGC controller 60.

Figure 2:
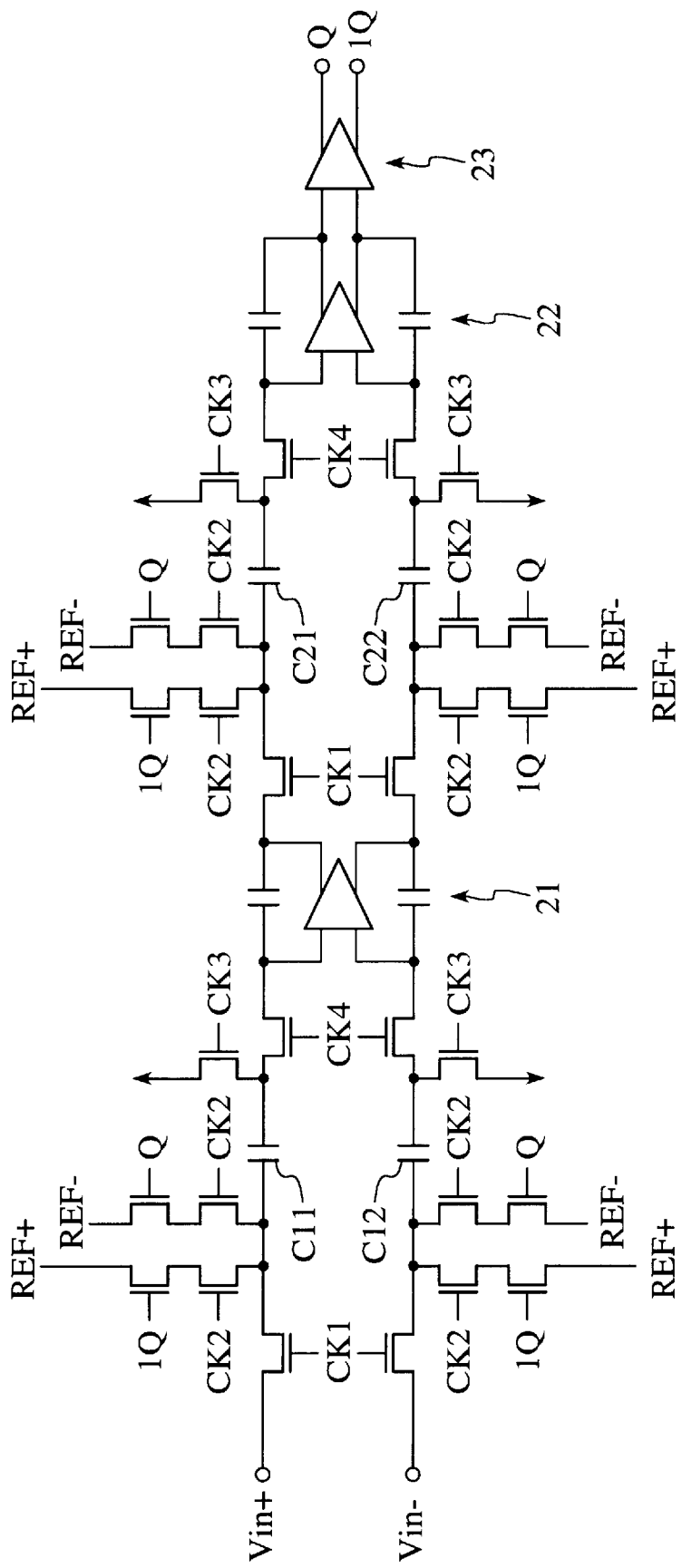
FIG. 2 is a circuit diagram illustrating an embodiment of a ΔΣ analog-to-digital converter in accordance with the present invention.
Figure 3:
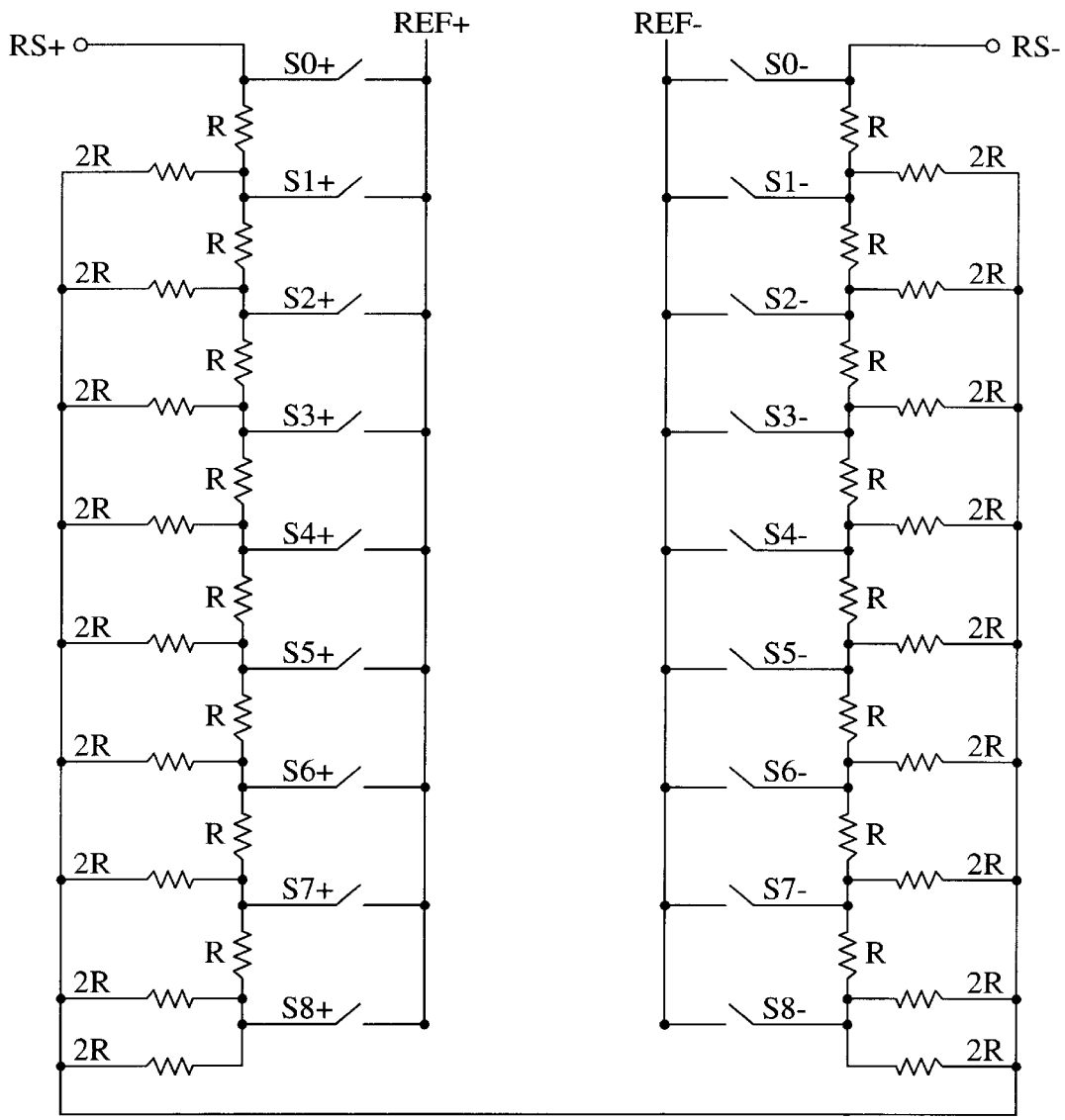
FIG. 3 is a circuit diagram illustrating a resister network as an example of an AGC portion that may be used with the present invention.

Referring to FIG. 2, ΔΣ analog-to-digital converter portion 70 may be embodied as a second order ΔΣ analog-to-digital converter having two differential operational amplifiers 21 and 22, sampling capacitors C11, C12, C21, and C22, and a plurality of MOS transistor switches. The final stage is formed with comparator (one-bit quantifier) 23 for generating one-bit digital signals Q and /Q. For overall gain control, a plurality of switches and a resistor network of resistors R and 2R are added to feedback ports REF+ and REF−, as illustrated in FIG. 3.

Referring to FIG. 2, ΔΣ analog-to-digital converting portion 70 may be a second order ΔΣ noise-shaping coder which receives input analog voltages Vin+ and Vin− and generates output digital codes Q and /Q (symbol "/" represents a bar) in which a signal component and shaped quantification noise are mixed. Codes Q and /Q becomes one-bit digital signals and are transmitted to the decimation filter, the next stage.

Codes Q and /Q control switches for coupling output voltages REF+ and REF− of the resistor network to the input stage according to necessary timing so that they are fed back to the input capacitor in an analog magnitude corresponding to the output code. Reference voltages RS+ and RS− are coupled to both ends of the resistor network so as to always supply the same reference voltages. REF+ and REF− are increased or decreased by two whenever the respective CMOS switches are closed. For instance, if S1+ and S1− are closed, REF+ and REF− become RS+/2 and RS−/2.

When reference voltages REF+ and REF− become 1/N of the reference voltages RS+ and RS−, this brings about an effect of increasing the magnitude of the signal component by N times. This yields signals amplification effect. In this case, N is possibly $2^8$, which yields the same effect as when an 8-bit AGC is incorporated.

A DSP measures the sensitivity of the input analog signal, controlling the magnitude of the AGC circuit. The reference voltages are output to REF+ and REF− when the respective switches S0+, S1+, S2+, S3+, . . . , S7+, S8+, S0−, S1−, S3−, . . . , S7−, S8− are turned on or off by the digital code from the DSP.

Figure 4:
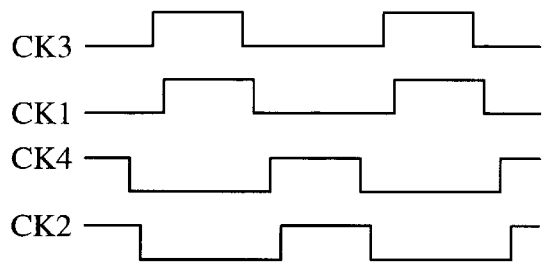
FIG. 4 illustrates waveforms of clocks operating the ΔΣ analog-to-digital converter of FIG. 2.

The overall operation will be described with reference to the clock diagrams of FIG. 4. Here, clocks CK1 and CK2 are slightly delayed versions of clocks CK3 and CR4, minimizing switching error when the switches are turned off.

At the first stage, clocks CK3 and CK1 become HIGH, and clocks CK4 and CK2 LOW such as is illustrated. The transistors to which clocks CK1 and CK3 are coupled are turned on. The transistors to which clocks CK2 and CK4 are coupled are turned off. In this state, the input analog signals Vin+ and Vin− are charged in capacitors C11 and C12. The output of differential operational amplifier 21 is charged in capacitors C21 and C22. During the previous clock cycle, there is an output from differential operational amplifier 21 and which is stored in capacitors C21 and C22.

At the second stage, clocks CK3 and CK1 become LOW, and clocks CK4 and CK2 HIGH such as is illustrated. The transistors to which clocks CK1 and CK3 are coupled are turned off. The transistors to which clocks CK2 and CK4 are coupled are turned on. In this state, the input analog signals Vin+ and Vin− are blocked by capacitors C11 and C12, and, at the same time, the charge stored in capacitors C11 and C12 is input to input ports + and − of differential operational amplifier 21. The + and − outputs of differential operational amplifier 21 are blocked by capacitors C21 and C22. The charge stored in capacitors C21 and C22 is input to input ports + and − of differential operational amplifier 22.

Comparator 23 receives outputs from differential operational amplifier 22, and compares them with a predetermined voltage. Outputs Q and /Q of comparator 23 turn on or off transistors coupled thereto, coupling reference voltages REF+ and REF− controlled to a predetermined magnitude to the input port of capacitors C11, C12, C21 and C22. According to outputs Q and /Q, voltages REF+ and REF− are coupled to the input port of the capacitors at the second timing, added and input to the amplifier. As a result, the reference voltages are fed back to the input according to outputs Q and /Q.

At the timing of clock pulses, an input analog signal is integrated and summed with the output voltage. The summed result is amplified and quantified. This is a ΔΣ A/D conversion.

As described above, the present invention is constructed in such a manner that the AGC required in the analog front end is incorporated in the ΔΣ analog-to-digital converter, reducing the amount of hardware and simplifying the process. In a conventional AGC, the resolution is limited due to the matching tolerance of passive devices, which determines the maximum resolution of the A/D converter. With the present invention, however, using the specific characteristics of the ΔΣ analog-to-digital converter, an equivalent effect of AGC is obtained, simplifying hardware and the overall process and improving resolution.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A ΔΣ analog-to-digital converter having a variable gain end comprising:

a ΔΣ analog-to-digital converter portion receiving an analog input signal, the converter portion comprising an amplifier for amplifying and outputting an input signal, a charging device for accumulating a signal voltage, a plurality of switches coupling the input signal to the charging device and coupling the voltage accumulated in the charging device to the amplifier, and a comparator for producing a HIGH output if the output of the amplifier rises above a predetermined level, and producing a LOW output if the output of the amplifier falls below the predetermined level, wherein the converter portion is operative in response to first and second reference voltages; and a scalable resistive network having first and second ends coupled to first and second voltages, respectively, wherein the scalable resistive network generates the first and second reference voltages, wherein the first and second reference voltages are generated from the first and second voltages through switches at respective nodes of a plurality of resistors of the scalable resistive network.

2. The converter of claim 1, wherein the amplifier comprises a differential operational amplifier.

3. The converter of claim 2, wherein the differential operational amplifier comprises a two stage amplifier.

4. The converter of claim 1, wherein the scalable resistive network is connected in a trapezoid configuration having two kinds of resistors.

5. The converter of claim 1, wherein the scalable resistive network comprises serially connected resistors.

6. The converter of claim 1, wherein the switches comprise NMOS transistors.

7. The converter of claim 1, wherein the switches are coupled to receive one or more inputs provided by a DSP, wherein the DSP provides the one or more inputs based on an amplitude of the analog input signal.

8. The converter of claim 1, wherein the scalable resistive network comprises an R-2R resistive ladder.

9. The converter of claim 1, wherein the scalable resistive network provides an AGC function for the analog input signal provided to the ΔΣ analog-to-digital converter.

10. The converter of claim 1, wherein the ΔΣ analog-to-digital converter and the scalable resistive network receive the analog input signal through a filter and comprise an analog front end for a facsimile modem.

11. An analog front end receiving an analog input signal, comprising:

a ΔΣ analog-to-digital converter receiving the analog input signal and receiving first and second reference voltages; and a resistive network receiving first and second voltages and generating the first and second reference voltages, wherein the first and second reference voltages are determined based on an amplitude of the analog input signal.

12. The analog front end of claim 11, wherein the resistive network comprises an R-2R resistive ladder.

13. The analog front end of claim 11, wherein the resistive network provides an AGC function for the analog input signal.

14. The analog front end of claim 11, wherein the ΔΣ analog-to-digital converter and the resistive network receive the analog input signal through a filter and comprise an analog front end for a facsimile modem.

15. The analog front end of claim 11, wherein the resistive network is coupled to a DSP and generates the first and second reference voltages based on inputs from the DSP, wherein the inputs from the DSP are determined in response to an amplitude of the analog input signal.

16. In an analog front end, a method of converting an analog input signal into a digital signal, comprising the steps of:

coupling the analog input signal to a ΔΣ analog-to-digital converter, wherein the ΔΣ analog-to-digital converter receives the analog input signal and first and second reference voltages and converts the analog input signal into a digital signal; and generating the first and second reference voltages with a resistive network, wherein the resistive network receives first and second voltages and generates the first and second reference voltages based on the first and second voltages and an amplitude of the analog input signal.

17. The method of claim 16, wherein the resistive network comprises an R-2R resistive ladder.

18. The method of claim 16, wherein the resistive network provides an AGC function for the analog input signal.

19. The method of claim 16, wherein the ΔΣ analog-to-digital converter and the resistive network receive the analog input signal through a filter and provide an analog front end for a facsimile modem.

20. The method of claim 16, further comprising the step of determining an amplitude of the analog input signal, wherein the resistive network is coupled to a DSP and generates the first and second reference voltages based on inputs from the DSP, wherein the inputs from the DSP are determined in response to the amplitude of the analog input signal.

* * * * *